United States Patent [19]
Tiemeijer et al.

[11] Patent Number: 5,812,715
[45] Date of Patent: Sep. 22, 1998

[54] OPTOELECTRONIC DEVICE WITH A COUPLING BETWEEN A SEMICONDUCTOR DIODE LASER MODULATOR OR AMPLIFIER AND TWO OPTICAL GLASS FIBERS

[75] Inventors: Lukas F. Tiemeijer; Sven Walczyk; Remigius S. M. Van Roemburg, all of Eindhoven, Netherlands

[73] Assignee: U.S. Philips Corporation, New York, N.Y.

[21] Appl. No.: 784,647

[22] Filed: Jan. 21, 1997

[30] Foreign Application Priority Data

Feb. 16, 1996 [EP] European Pat. Off. .............. 96200394

[51] Int. Cl.[6] ...................................... G02B 6/30
[52] U.S. Cl. ................. 385/73; 385/89; 385/92; 385/93; 385/94
[58] Field of Search ..................... 385/88–94, 73

[56] References Cited

U.S. PATENT DOCUMENTS

| | | | |
|---|---|---|---|
| 4,944,569 | 7/1990 | Boudreu et al. | 350/96.2 |
| 4,983,009 | 1/1991 | Musk | 350/96.18 |
| 5,408,559 | 4/1995 | Takahashi et al. | 385/89 |
| 5,487,124 | 1/1996 | Bowen et al. | 385/93 |
| 5,579,426 | 11/1996 | Li et al. | 385/88 |

Primary Examiner—John Ngo

[57] ABSTRACT

The invention relates to an optoelectronic device with a module comprising a holder with an amplifier and on either side thereof a lens and a glass fiber which can be aligned relative to the amplifier. The module also comprises two monitor diodes. A disadvantage of the known device is that the lenses cannot be easily aligned relative to the amplifier, and the monitor diodes cannot be easily connected electrically. The use of a spherical lenses also poses a problem. In a device according to the invention, the monitor diodes are so positioned that they are capable of detecting radiation reflected at the outside of the lenses instead of radiation refracted and reflected within the lenses, while the radiation-sensitive surfaces of the monitor diodes are positioned such that they receive more radiation from one lens than from the other lens. This renders it possible to place the monitor diodes on a separate, further holder at some distance away from the amplifier and the lenses, each being aimed at one of the two lenses. This facilitates both the alignment of the lenses relative to the amplifier and the electrical connection of the monitor diodes. The lenses, which now no longer bear on the monitor diodes are also allowed to be a spherical now. Both the operation of the amplifier and the value of the output signal can be monitored very well in this manner. The further holder preferably has a T-shape with a wedge end on which the monitor diodes are present and which is immediately above the amplifier. The device according to the invention can be very compact. The angle of the wedge portion preferably lies between 45° and 90°.

10 Claims, 3 Drawing Sheets

OPTOELECTRONIC DEVICE WITH A COUPLING BETWEEN A SEMICONDUCTOR DIODE LASER MODULATOR OR AMPLIFIER AND TWO OPTICAL GLASS FIBERS

BACKGROUND OF THE INVENTION

The invention relates to an optoelectronic device comprising an optoelectronic module which comprises at least a holder for a semiconductor diode laser modulator or amplifier, referred to as amplifier for short hereinafter, between a first and a second lens by means of which a first and a second optical glass fiber can be aligned with the amplifier, and a first and a second monitor diode for detecting radiation entering or leaving the amplifier.

Such devices are widely used in systems for optical glass fiber communication and form an attractive alternative to the combination of a detector and a laser in the on-line amplification or modulation of optical signals. They may also be placed immediately, or at least shortly behind a laser, in which case they are called booster amplifiers.

Such a device is known from U.S. Pat. No. 4,983,009 published on Aug. 1, 1991. The module shown in FIG. 3 thereof comprises a holder with an amplifier on top with two lenses placed on either side. Part of the radiation entering or leaving the amplifier is refracted within the lenses and, after multiple reflection, issues from the inside of the lenses from the lower sides thereof, where it hits the radiation-sensitive surfaces of monitor diodes which are present on the amplifier holder and on which the lower sides of the lenses bear. Two optical glass fibers (not shown in the Figure) aligned relative to the amplifier by means of the lenses are present in front of the first lens and behind the second lens.

A disadvantage of the known device is that its alignment is not easy. This is because the alignment of a lens relative to the amplifier and that of a photodiode relative to the lens are not mutually independent. The construction of the known device is in addition difficult to manufacture, in particular when the lenses are aspherical, unlike in the known device, i.e. have a shape other than a spherical shape. Another disadvantage of the known device is that an electrical connection of the amplifier, and especially of the monitor diodes, is comparatively difficult in the given construction.

SUMMARY OF THE INVENTION

It is an object of the invention to provide a device of the kind mentioned in the opening paragraph which is not subject to the above disadvantages, or at least to a much lesser degree, in which the alignment and electrical connection are readily made, and which is simple to manufacture also in other respects, especially in the case of aspherical lenses.

According to the invention, a device of the kind mentioned in the opening paragraph is for this purpose characterized in that the first and the second monitor diode are arranged within the device such that they are capable of detecting part of the radiation reflected at the outside of the first and the second lens, and in that the radiation-sensitive surfaces of the first and the second monitor diode are positioned such that the first monitor diode receives more radiation from the first lens than from the second lens and the second monitor diode receives more radiation from the second lens than from the first lens. An arrangement of the monitor diodes such that they are capable of catching radiation reflected at the outsides of the lenses means that the monitor diodes can be some distance away from the lenses. This again means that the monitor diodes can be placed on a holder other than that of the lenses. The alignment of the lenses relative to the amplifier is thus no longer hampered or influenced by the presence of the monitor diodes, and the latter can be more easily and simply provided with electrical connections. Moreover, the manufacture is considerably simplified in particular in the case of aspherical lenses. The radiation-sensitive surfaces of the monitor diodes are so positioned that the two monitor diodes are each aligned substantially with a single lens and substantially do not receive radiation originating from the other lens. The electrical signal of the first monitor diode as a result is a measure for the intensity of the spontaneous emission of the amplifier plus that of the input signal, and the signal of the second monitor diode for the intensity of the spontaneous emission of the amplifier plus that of the amplified signal.

Since in practice the spontaneous emission is usually much greater than the input signal, the signal of the first monitor diode is in fact a measure for the intensity of said spontaneous emission, and the differential signal of the second and first monitor diodes is a measure for the amplified signal minus the input signal, i.e. for the amplified signal. The use of an optical filter is not necessary for this. The invention is based inter alia on the recognition that the radiation reflected at the outside of the lenses, though of a very low intensity, can be detected by means of the monitor diodes in practice, even though the lenses are provided with a usual anti-reflection layer. The fact that the electrical signals of the monitor diodes do not arise in the known device until after multiple reflection of the relevant optical signals within the lens plays an important part here as well, whereas these signals arise in the device according to the invention after the relevant optical signals have been reflected no more than once. It will be obvious that a good operation of the amplifier and the strength of the output signal can be determined much better and more easily in a device according to the invention. A correction of the adjustment of the amplifier or of the amplified signal is also possible in this way.

In a preferred embodiment of a device according to the invention, therefore, the first and the second monitor diode are present on a further holder which is present above that portion of the holder where the amplifier is present. The lenses may then be readily aligned relative to the amplifier by means of a suitable construction of the holder. The monitor diodes may also be readily provided with electrical connections. In a particularly favorable modification of this preferred embodiment, the further holder comprises a wedge-shaped portion which is directed with mirror symmetry towards the amplifier and on whose side faces the monitor diodes are present so as to be aimed at the first and the second lens, respectively. The device according to the invention can be particularly compact thanks to such a shape and placement of the further holder for the two monitor diodes. In addition, the signals of the two monitor diodes will be substantially a maximum in that case, and each of the monitor diodes will receive as little radiation as possible which is destined for the relevant other monitor diode. These are important advantages. The wedge-shaped portion on which the monitor diodes are arranged optimally screens the radiation-sensitive areas of the monitor diodes off from one another in a simple manner and gives them the desired angle relative to the lenses.

The holder of the amplifier and the lenses is preferably made of metal, for example steel. This is to provide an optimum cooling and temperature stabilization of the amplifier. The holder may be readily manufactured with high accuracy in that case, and it is possible to fix adjustable parts of the holder by means of welding or soldering. The further holder may comprise an electrically insulating material such as a ceramic material. Preferably, however, the further holder also comprises a metal, especially with a view to an easy and accurate manufacture.

In an important further embodiment, the holder for the amplifier and the lenses is of a coaxial construction and comprises a central part on which the amplifier is present, above which the further holder is present, and which is provided with bushes on either side within which the lenses are arranged and on which the further holder is fastened, which further holder in cross-section has a T-shape at the lower side of which the wedge-shaped portion with the monitor diodes is present. Such a device is very compact on the one hand, while on the other hand it affords an easy access to the amplifier, the lenses, and the monitor diodes during mounting. These components may as a result be readily aligned or provided with electrical connections. Mounting is considerably simplified in this manner.

Preferably, the lenses are aligned relative to the amplifier by means of further (metal) bushes and fixed in place through (laser) welding of the further bushes and the bushes. The arms of the T-shaped further holder are fastened to the bushes, which are provided each with a facet for this purpose. The leg projects into the space between the bushes. The wedge-shaped end is then immediately above the amplifier, while the side faces thereof are directed towards the lenses. The optimum angle of the wedge-shaped part, and thus the optimum angle enclosed by the radiation-sensitive surfaces of the monitor diodes, depend on the exact geometry and dimensions of the device and lies in practice between 45 and 90 degrees, for example, approximately 70 degrees.

Preferably, both the holder and the further holder are made of metal and are fastened to one another by means of a first electrical insulator which is metallized on two sides, a side face and an upper face of the further holder are provided with a second and a third electrical insulator, respectively, also metallized on two sides, on each of which insulators two conductive regions are present, the first and the second monitor diode are connected to the conductive regions on the second electrical insulator by means of wire connections, and the conductive regions on the second electrical insulator are connected to the conductive regions on the third electrical insulator by means of wire connections. The advantages of a metal holder and further holder have been mentioned above. In the construction described here, the amplifier as well as the monitor diodes are or can be electrically connected in a simple manner. The electrical insulators are preferably plane, made of ceramic material, and fastened by soldering.

In a further favorable modification, the lenses are aspherical. In that case a good coupling between the amplifier and a glass fiber can be realized by means of only a single lens. Preferably, the lenses are each provided with an anti-reflection layer. No feedback of radiation reflected at the lenses to the amplifier takes place in that case, which is highly desirable.

Preferably, a device according to the invention comprises a box of which at least one side face is provided with at least one row of electrically insulated electrical lead-through conductors and within which the optoelectronic module is present with the holder and the further holder which are connected to the electrically insulated lead-through conductors by means of wire connections. Such a device, which is of the so-called BF (=Butterfly) type or the DIL (=Dual In Line) type, offers major advantages in practice. The connection points of the monitor diodes on the further holder are readily accessible and may be easily connected to the relevant electrically insulated lead-through conductors of the box by means of wire connections. This wire connection is allowed to be comparatively long because the requirements imposed on the monitor diodes are usually not very stringent as to the response rate. If it is desired to read also the optical signal from the monitor diodes, for which accordingly a high response rate is desired, the strip-line technique may be advantageously used for connecting the monitor diodes. It is also possible to rotate the further holder through (approximately) 90 degrees in the direction of the electrically insulated lead-through conductors in the device. The connections of the monitor diodes can then be much shorter, and accordingly faster.

BRIEF DESCRIPTION OF THE DRAWINGS

The invention will be explained in more detail below with reference to an embodiment shown in the drawing, in which FIG. 1 diagrammatically shows an optoelectronic device according to the invention in plan view, partly broken away.

The Figures are diagrammatic and not drawn true to scale. Corresponding parts have been given the same reference numerals as a rule in the various Figures.

DESCRIPTION OF THE PREFERRED EMBODIMENTS

Figure 1:
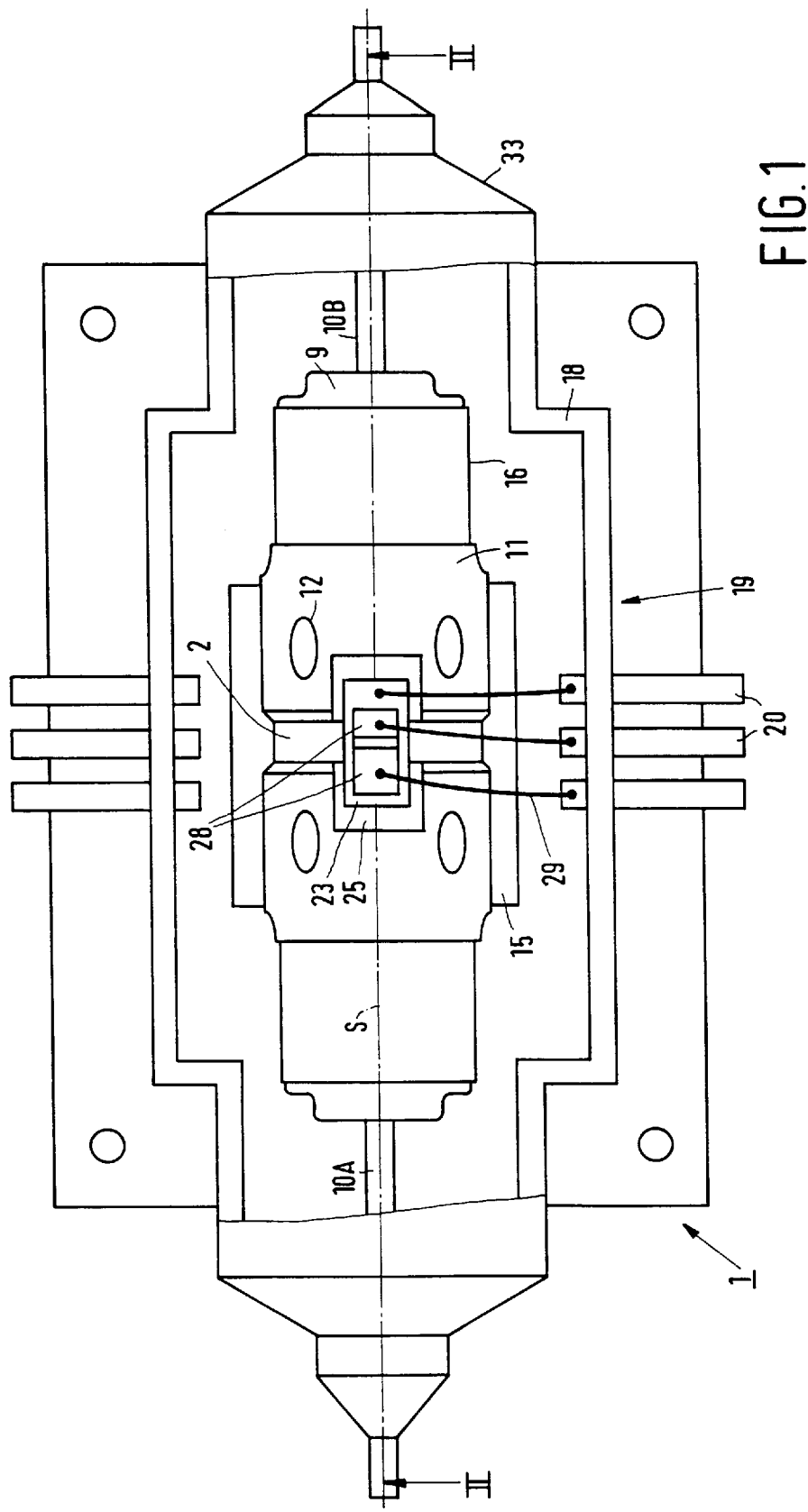
Figure 2:
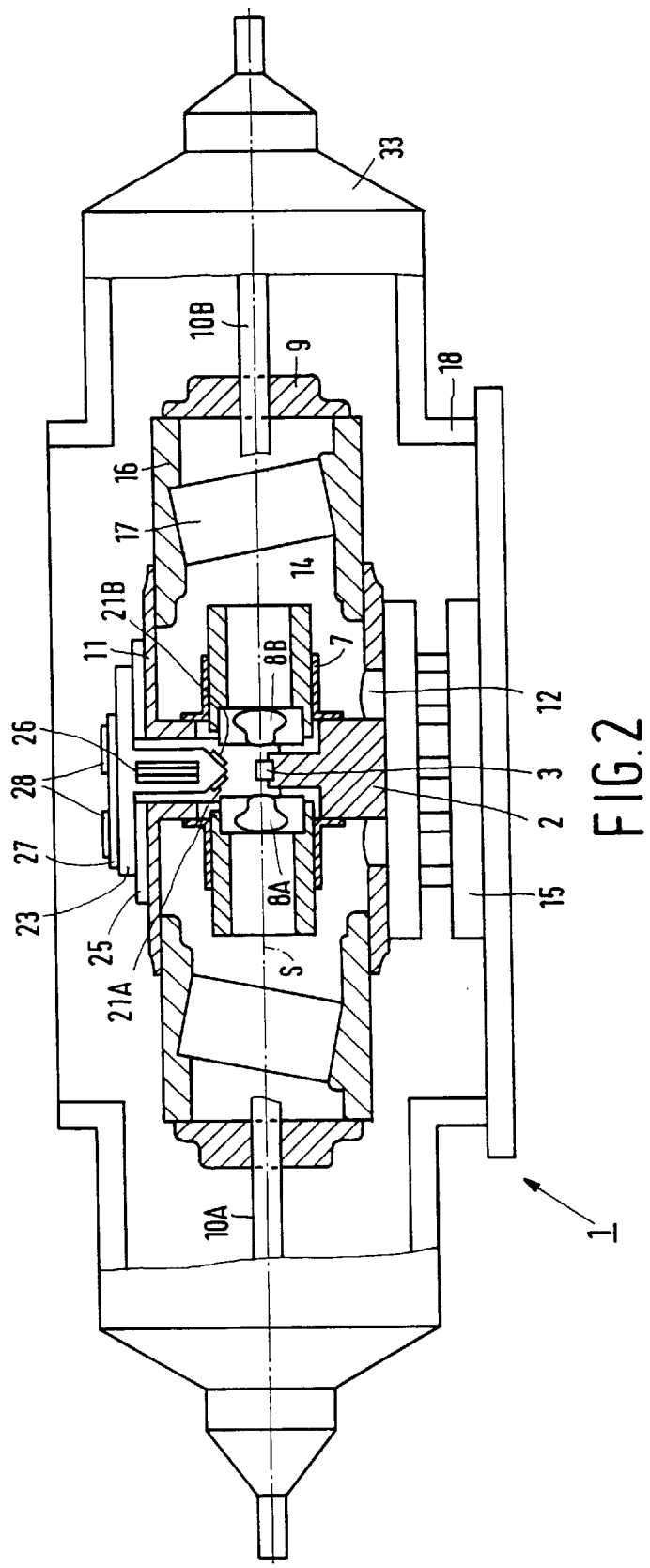
FIG. 2 diagrammatically shows the device of FIG. 1 in cross-section taken on the line II—II, and FIG. 3 diagrammatically shows part of the optoelectronic device of FIGS. 1 and 2 in perspective view.
Figure 3:
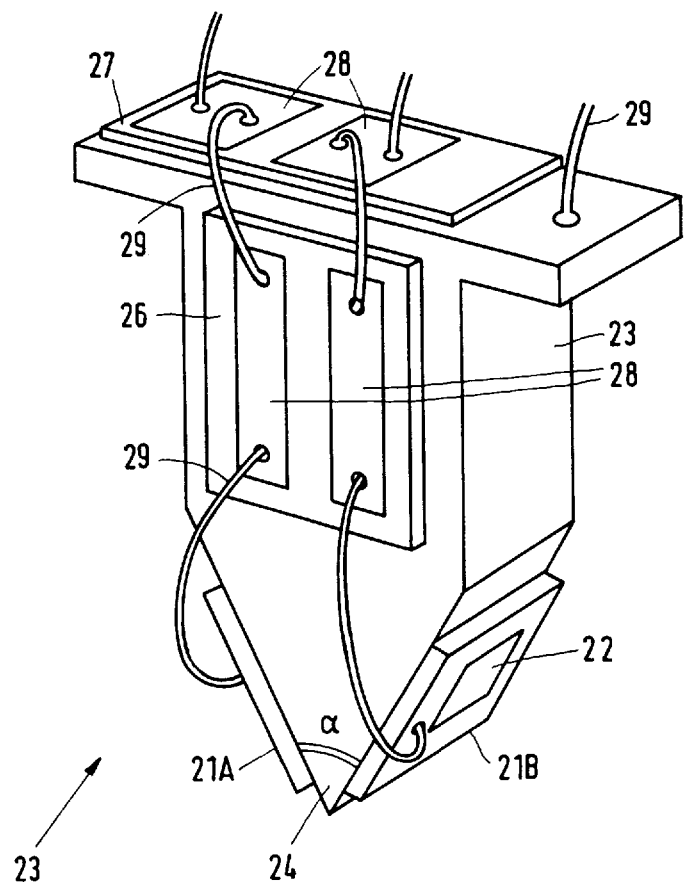

FIG. 1 is a diagrammatic plan view, partly broken away, of an optoelectronic device according to the invention. FIG. 2 is a diagrammatic cross-section of the device of FIG. 1 taken on the line II—II, and FIG. 3 diagrammatically shows part of the device of FIGS. 1 and 2 in perspective view. The device comprises (see especially FIG. 2) a module 1 with a holder 2 on which a semiconductor diode laser amplifier 3, here a polarization-insensitive multi-quantum-well 1310-nm laser amplifier, is present between two lenses 8 by means of which two glass fibers 10 can be aligned relative to the amplifier 3.

The module 1 also comprises two monitor diodes 21, here two InGaAs monitor diodes 21 of 300 $\mu$m diameter.

According to the invention, the two monitor diodes 21 are so positioned within the module 1 that they are capable of detecting radiation reflected at the outside of the lenses 8, while the radiation-sensitive surfaces 22 (see FIG. 3) of the monitor diodes 21 are positioned such that the first monitor diode receives more radiation from the first lens than from the second lens and the second monitor diode receives more radiation from the second lens than from the first lens. This means that the monitor diodes 21 are placed at some distance from the lenses 8. As a result, the monitor diodes 21 may be placed on a further holder 23, as is the case here, which is not identical to the holder 2 for the lenses 8 and in this case also for the amplifier 3. The alignment of the lenses 8 may be carried out more easily as a result because it is not hampered by the monitor diodes 21. It has also become simpler to provide the monitor diodes 21 with connection conductors 29. The use of lenses 8 which are aspherical, as in the present example, is also facilitated thereby. The fact that the radiation-sensitive surfaces 22 of the monitor diodes 21 are turned away from one another and are made to enclose an angle with one another here which is greater than zero degrees achieves that the two monitor diodes 21 in this example are each substantially aligned to a single lens 8A, 8B and substantially do not receive radiation originating from the other lens 8B, 8A. The electrical signal from the first monitor diode 21A is thus mainly a measure for the intensity of the spontaneous emission generated in the amplifier. The second monitor diode 21B then mainly measures the amplified radiation plus the spontaneous emission. In spite of the low intensity of said reflections - the lenses 8 are preferably provided with an anti-reflection coating, as in the present example, the resulting electrical signals are sufficiently strong for monitoring the operation of the amplifier and the output signal. In any case, the values of the electrical signals in the two monitor diodes 21 will be substantially higher than in the known device, where the optical signals do not reach the monitor diodes 21 until after a repeated reflection, whereby the intensities of the optical signals have been strongly reduced upon reaching the monitor diodes 21.

The further holder 23 in this example is present above that portion of the holder 2 where the amplifier 3 is present and here comprises a wedge-shaped portion 24 which is directed with mirror symmetry at the amplifier 3 and on the side faces of which the monitor diodes 21 are present. The monitor diodes 21 may be readily aimed at the individual lenses 8 by virtue of this symmetrical shape and construction. Moreover, the spontaneous emission of the amplifier 3 will generate an approximately equal electrical signal in each of the two monitor diodes 21. When the signal of the first monitor diode 21A is subtracted from the signal of the second monitor diode 21B, the result will be a measure for the intensity of the amplified radiation. The correct functioning of the amplifier 3 and the value of the amplified signal may be monitored very well in this manner by the two monitor diodes 21. The module 1 can also be very compact as a result, as will become apparent further below. The optimum angle $\alpha$ between the radiation-sensitive surfaces 22 of the monitor diodes 21 depends on the geometry and dimensions of the device and its components. In practice, the most favorable value for the angle $\alpha$ is found to lie between approximately 45° and 90°. In this example, the angle $\alpha$ is approximately 70°. Any polarization dependence of the signals from the monitor diodes 21 may also be compensated for through a change in the angle enclosed by the monitor diodes 21 and the reflections originating from the lenses 8.

In this embodiment of the device, the holder 2 for the amplifier 3 and the lenses 8 is of a coaxial construction and comprises a central portion on which the amplifier 3 is arranged, and is provided with bushes 11 within which the lenses 8 are present. The device is thus particularly compact, which is a major advantage. The lenses 8 are here accommodated in cylindrical lens holders which comprise further bushes 7, 14 which, after alignment in the x, y and z directions, are fastened to one another and to the bushes 11. The further holder 23 is T-shaped in cross-section and is fastened to the cylindrical bushes 11, which are provided with facets for this purpose. The wedge-shaped part 24 with the monitor diodes 21 thereon is present at the lower side of the further holder 23.

The holder 2 of the amplifier 3 and of the lenses 8 and the further bushes 7, 14 are made of metal, of steel in this case. As a result, these components can be readily manufactured with high accuracy, and the adjustable parts can be fixed by (laser) welding or soldering. This also means that the holder 2 can be readily cooled or kept at a stable temperature, in this case by means of a Peltier element 15. The further holder 23 is also made of steel here. Between the further holder 23 and the bushes 11 there is a first electrical insulator 25 which is metallized on two sides. A side face and the upper face of the further holder 23 are provided with a second and a third electrical insulator 26, 27, respectively, also metallized on two sides. The electrical insulators 25, 26, 27 comprise ceramic plates 25, 26, 27, while the second and third electrical insulators 26, 27 are each provided with two conductive regions 28 on one side. The electrical connections between the monitor diodes 21 and between the second and third insulators 26, 27 comprise wire connections 29 here.

Soldering is used for fastening the monitor diodes 21 to the further holder 23 and of the electrical insulators 25, 26, 27 and the further holder 23 itself, but alternative fastening techniques may also be used. The monitor diodes 21 and the second and third electrical insulators 26, 27 are fastened to the further holder 23 by means of a high-melting AuSn solder ($T_s$=280° C.). The further holder 23 is fastened to the holder 2 via the first electrical insulator 25 by means of a low-melting PbSn solder ($T_s$=180° C.). It is prevented in this manner that the components 21, 26, 27 fastened to the further holder 23 can work themselves loose (again) when this further holder itself is being fastened. In the present example, the two glass fibers 10 are accommodated in the device in two holders 9 in a non-detachable manner. The glass fiber holders 9 are fastened to the bushes 11 via further bushes 16 each with an optical isolator 17. Since the lenses 8 are aspherical, no more than two lenses 8 are necessary for realizing a good coupling efficiency. This also contributes to the compactness of the device. The amplifier 3 is subject to very little feedback thanks to the anti-reflection layers on the lenses 8 (not shown in the Figures).

The present embodiment of the device comprises a box 18 of the BF type. This means that two side faces 19 of the box 18 are each provided with a row of electrically insulated lead-through conductors 20. The electrical connections between the conductors 20 and the monitor diodes 21 are achieved by means of wire connections 29. The connection of the amplifier 3 is not shown in the Figures. The box 18 is particularly compact: length, width, and height are no more than approximately 10, 12, and 12 mm, respectively.

Very good results were obtained with the present embodiment of the device. Given a feedback loop for controlling the optical gain of the amplifier 3, it is possible to use not only the current through the amplifier 3 but also—if the current remains constant—the temperature of the amplifier 3 obtained via the Peltier element. In the former case it was found to be possible to stabilize a 5 dBm amplified signal to within 2 dB for an input signal range of 25 dB. With the use of the temperature, a stabilization to within 0.5 dB was even found to be possible for the same input signal range. These values ensure that any fluctuation of the signal power in a long chain of amplifiers 3 will disappear quickly and that an optimum BER (Bit Error Rate) behavior can be maintained over a long period in such a system.

The device according to the present example is manufactured as follows (see FIGS. 1 and 2). The amplifier 3 is fastened on the holder 2. Then the lenses 8 are aligned by means of the bushes 7, 14 and fastened to the bushes 11 by (laser) welding through the openings 12 in the bushes 11. Similarly, the other bushes 9, 16 and the glass fibers 10 are aligned relative to the amplifier 3 and fastened to the holder 2. Subsequently, the further holder 23 is placed between and on the bushes 11 as shown in FIG. 3 and fastened thereto. The sub-module obtained in this manner is subsequently fastened on the Peltier cooler 15 in the box 18, whereupon the amplifier 3 and the further holder 23 are connected to the electrical conductors 20. Finally, sealants 33 and a lid are applied on the box 18.

The invention is not limited to the embodiment described, since many modifications and variations are possible to those skilled in the art within the scope of the invention. Thus materials or dimensions other than those mentioned in the embodiment may be used. The device may advantageously also comprise other electronic components such as resistors and capacitors.

It is further noted that reflected radiation which has first undergone one or several reflections within the device may also reach the monitor diodes.

It is finally noted that the construction of the further holder on which the monitor diodes are present may alternatively be such that it has a plane side facing towards the amplifier. Since the monitor diodes are arranged next to one another, they can still have sufficiently different sensitivities to reflections originating from each of the two lenses. The further holder may also be provided with a, for example rectangular, projecting part which is present on an otherwise plane side of the further holder and on either side of which the monitor diodes are present. This projecting part enhances the selectiveness of the sensitivities of the monitor diodes.

What is claimed is:

1. An optoelectronic device comprising an optoelectronic module which comprises at least a holder for a semiconductor diode laser modulator or amplifier between a first lens and a second lens by means of which a first optical glass fiber and a second optical glass fiber can be coupled to the amplifier, and a first monitor diode and a second monitor diode for detecting radiation entering or leaving the amplifier, characterized in that the first and the second monitor diodes are arranged within the device such that they are capable of detecting part of the radiation reflected at the outside of the first and the second lens, and in that the radiation-sensitive surfaces of the first and the second monitor diodes are positioned such that the first monitor diode receives more radiation from the first lens than from the second lens and the second monitor diode receives more radiation from the second lens than from the first lens.

2. An optoelectronic device as claimed in claim 1, characterized in that the first and the second monitor diodes are present on a further holder, and said further holder is present above that portion of the holder where the amplifier is present.

3. An optoelectronic device as claimed in claim 2, characterized in that the further holder comprises a wedge-shaped portion which is directed with mirror symmetry towards the amplifier and on whose side faces the first and the second monitor diode are present so as to be aimed at the first and the second lens, respectively.

4. An optoelectronic device as claimed in claim 3, characterized in that the holder for the amplifier and the lenses is of a coaxial construction and comprises a central part on which the amplifier is present, above which the further holder is present, and which is provided with bushes on either side within which the lenses are arranged and on which the further holder is fastened, which further holder in cross-section has a T-shape at the lower side of which the wedge-shaped portion with the monitor diodes is present.

5. An optoelectronic device as claimed in claim 2, characterized in that both the holder and the further holder are made of metal and are fastened to one another by means of a first electrical insulator which is metallized on two sides, a side face and an upper face of the further holder are provided with a second and a third electrical insulator, respectively, metallized on two sides, on each of which insulators two conductive regions are present, the first and the second monitor diode are connected to the conductive regions on the second electrical insulator by means of wire connections, and the conductive regions on the second electrical insulator are connected to the conductive regions on the third electrical insulator by means of wire connections.

6. An optoelectronic device as claimed in claim 2, characterized in that the monitor diodes are fastened to the further holder by means of a high-melting solder, and the further holder is fastened inside the device by means of a low-melting solder.

7. An optoelectronic device as claimed in claim 1, characterized in that the radiation-sensitive surfaces of the first and second monitor diodes enclose an angle ($\alpha$) between approximately 45 degrees and approximately 90 degrees.

8. An optoelectronic device as claimed in claim 1, characterized in that the lenses are aspherical and are preferably provided each with an anti-reflection layer.

9. An optoelectronic device as claimed in claim 1, characterized in that the module comprises a box of which at least one side face is provided with at least one row of electrically insulated electrical lead-through conductors, within which box the holder and the further holder are present and the further holder is connected to the electrically insulated lead-through conductors by means of wire connections.

10. A method of operating an optoelectronic device as claimed in claim 1, characterized in that the temperature of the semiconductor diode laser is used for controlling the gain of the semiconductor diode laser.

* * * * *